(12) United States Patent
Kawai

(10) Patent No.: US 9,018,611 B2
(45) Date of Patent: Apr. 28, 2015

(54) SEMICONDUCTOR STORAGE DEVICE AND MANUFACTURING METHOD THE SAME

(75) Inventor: Murato Kawai, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 184 days.

(21) Appl. No.: 13/601,353

(22) Filed: Aug. 31, 2012

(65) Prior Publication Data

US 2013/0248804 A1    Sep. 26, 2013

(30) Foreign Application Priority Data

Mar. 22, 2012 (JP) ................. 2012-065335

(51) Int. Cl.
*H01L 29/02* (2006.01)
*H01L 45/00* (2006.01)
*H01L 27/24* (2006.01)

(52) U.S. Cl.
CPC ........ *H01L 45/1253* (2013.01); *H01L 45/1608* (2013.01); *H01L 45/04* (2013.01); *H01L 45/1233* (2013.01); *H01L 45/1675* (2013.01); *H01L 27/2409* (2013.01); *H01L 27/2481* (2013.01)

(58) Field of Classification Search
USPC ...................... 257/99, 98, 103, 347, E45.002, 257/E45.003; 438/22, 478
See application file for complete search history.

(56) References Cited

U.S. PATENT DOCUMENTS

| 2008/0258129 | A1 | 10/2008 | Toda |
| 2009/0283739 | A1 | 11/2009 | Kiyotoshi et al. |
| 2010/0202186 | A1* | 8/2010 | Sato et al. ............. 365/148 |
| 2011/0001112 | A1 | 1/2011 | Kiyotoshi |
| 2011/0068314 | A1 | 3/2011 | Takahashi et al. |
| 2011/0069525 | A1 | 3/2011 | Fukumizu et al. |
| 2012/0211721 | A1 | 8/2012 | Kawai |

FOREIGN PATENT DOCUMENTS

| JP | 2005-522045 | 7/2005 |
| JP | 2009-283486 A | 12/2009 |
| JP | 2011-14795 | 1/2011 |
| JP | 2011-14796 | 1/2011 |
| JP | 2011-71167 | 4/2011 |
| JP | 2011-71229 | 4/2011 |
| JP | 2011-71302 | 4/2011 |

OTHER PUBLICATIONS

Office Action issued May 13, 2014 in Japanese Patent Application No. 2012-065335 (with English translation).
U.S. Appl. No. 13/777,052, filed Feb. 26, 2013, Noda.

* cited by examiner

*Primary Examiner* — Mark A Laurenzi
(74) *Attorney, Agent, or Firm* — Oblon, McClelland, Maier & Neustadt, L.L.P.

(57) ABSTRACT

A semiconductor storage device according to an embodiment includes a first conductive layer, a variable resistance layer, an electrode layer, a first liner layer, a stopper layer, and a second conductive layer. The variable resistance layer is provided above the first conductive layer. The electrode layer contacts an upper surface of the variable resistance layer. The first liner layer contacts the upper surface of the electrode layer. The stopper layer contacts the upper surface of the first liner layer. The second conductive layer is provided above the stopper layer. The first liner layer is made of a material having a property for canceling an influence of an orientation of a lower layer of the first liner layer, the property of the first liner layer being superior compared with that of the stopper layer.

12 Claims, 8 Drawing Sheets

SEMICONDUCTOR STORAGE DEVICE AND MANUFACTURING METHOD THE SAME

CROSS-REFERENCE TO RELATED APPLICATIONS

This application is based upon and claims the benefit of priority from the prior Japanese Patent Application No. 2012-65335, filed on Mar. 22, 2012, the entire contents of which are incorporated herein by reference.

FIELD

Embodiments described herein relate to a semiconductor storage device and a manufacturing method the same.

BACKGROUND

Nowadays, electrically rewritable resistance variation memories, such as an ReRAM and a PRAM, attract attention as a semiconductor storage device. A memory cell of the resistance variation memory is configured to be able to change a resistance value, and data is stored in the resistance variation memory by the change of the resistance value. The resistance variation memory is provided between a word line and a bit line.

However, sometimes the resistance variation memory works insufficiently due to an interconnection resistance of the word line or the bit line.

DETAILED DESCRIPTION

A semiconductor storage device according to an embodiment includes a first conductive layer, a variable resistance layer, an electrode layer, a first liner layer, a stopper layer, and a second conductive layer. The variable resistance layer is provided above the first conductive layer. The electrode layer contacts an upper surface of the variable resistance layer. The first liner layer contacts the upper surface of the electrode layer. The stopper layer contacts the upper surface of the first liner layer. The second conductive layer is provided above the stopper layer. The first liner layer is made of a material having a property for canceling an influence of an orientation of a lower layer of the first liner layer, the property of the first liner layer being superior compared with that of the stopper layer.

Hereinafter, a semiconductor storage device according to the embodiment will be described with reference to the drawings.

First Embodiment

[Configuration]

Figure 1:
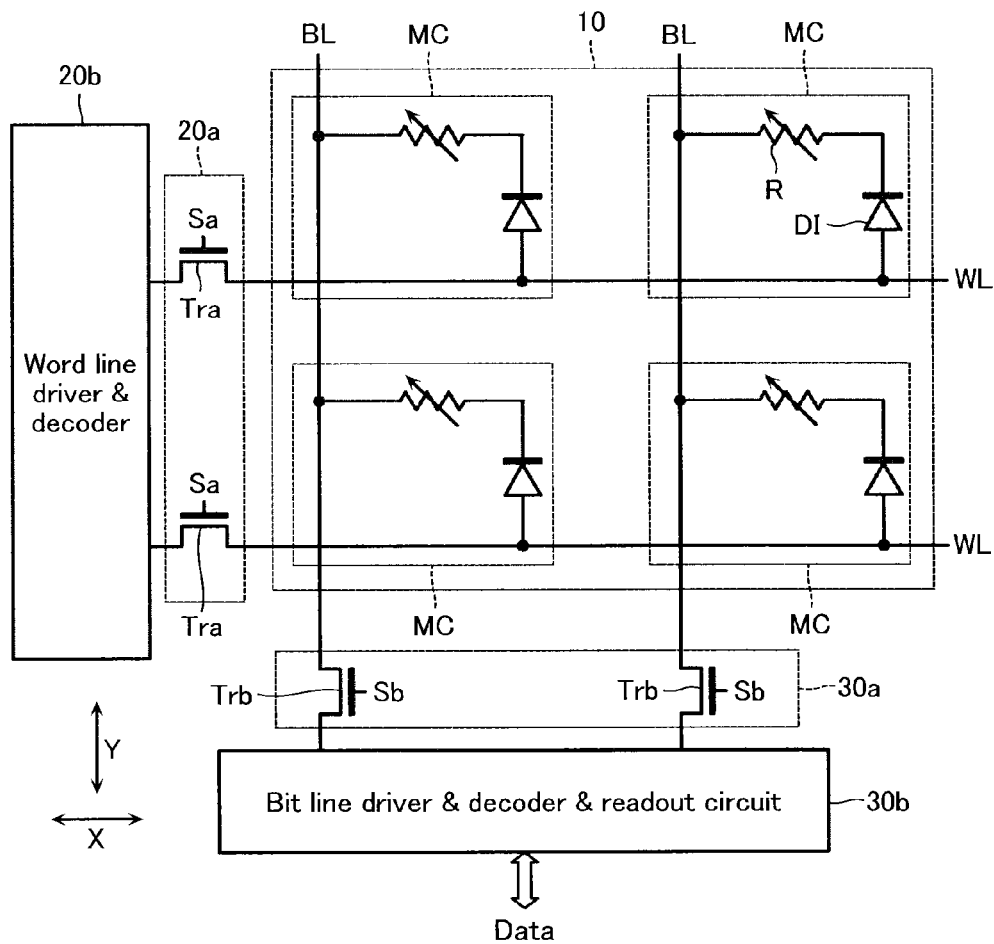
FIG. 1 is a circuit diagram of a semiconductor storage device according to a first embodiment.

A circuit configuration of a semiconductor storage device according to a first embodiment will be described below with reference to FIG. 1. Referring to FIG. 1, the semiconductor storage device of the first embodiment includes a memory cell array 10, a word line selector circuit 20a, a word line driver circuit 20b, a bit line selector circuit 30a, and a bit line driver circuit 30b.

The memory cell array 10 includes word lines WL and bit lines BL, which intersect each other, and memory cells MC each disposed in an intersection of the word line WL and the bit line BL. The word lines WL are arrayed in a Y-direction at predetermined intervals, and extend in an X-direction. The bit lines BL are arrayed in the X-direction at predetermined intervals, and extend in the Y-direction. That is, the memory cells MC are arranged in a matrix form on a surface formed in the X-direction and the Y-direction.

The memory cell MC includes a diode DI and a variable resistance element R as illustrated in FIG. 1. An anode of the diode DI is connected to the word line WL, and a cathode is connected to one end of the variable resistance element R. The variable resistance element R is electrically rewritable, and stores data in a nonvolatile manner based on a resistance value. The other end of the variable resistance element R is connected to the bit line BL.

The word line selector circuit 20a includes plural selection transistors Tra as illustrated in FIG. 1. One end of the selection transistor Tra is connected to one end of the word line WL, and the other end of the selection transistor Tra is connected to the word line driver circuit 20b. A signal Sa is supplied to a gate of the selection transistor Tra. That is, the word line selector circuit 20a controls the signal Sa, thereby selectively connecting the word line WL to the word line driver circuit 20b.

As illustrated in FIG. 1, the word line driver circuit 20b applies a voltage, which is necessary to erase the data from the memory cell MC, write the data in the memory cell MC, and read the data from the memory cell MC, to the word line WL.

As illustrated in FIG. 1, the bit line selector circuit 30a includes plural selection transistors Trb. One end of the selection transistor Trb is connected to one end of the bit line BL, and the other end of the selection transistor Trb is connected to the bit line driver circuit 30b. A signal Sb is supplied to the gate of the selection transistor Trb. That is, the bit line selector circuit 30a controls the signal Sb, thereby selectively connecting the bit line BL to the bit line driver circuit 30b.

As illustrated in FIG. 1, the bit line driver circuit 30b applies the voltage, which is necessary to erase the data from the memory cell MC, write the data in the memory cell MC, and read the data from the memory cell MC, to the bit line BL. The bit line driver circuit 30b externally outputs the data read from the bit line BL.

Figure 2:
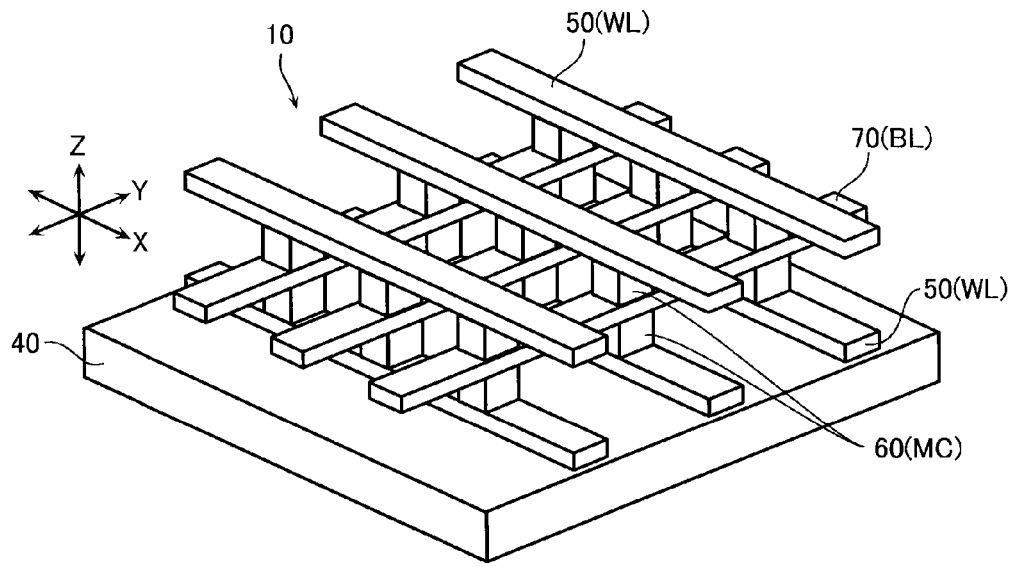
FIG. 2 is a schematic perspective view of a memory cell array 10 according to the first embodiment.

Next, a stacked structure of the memory cell array 10 of the first embodiment will be described below with reference to FIG. 2. Referring to FIG. 2, the memory cell array 10 is formed above a substrate 40. The memory cell array 10 includes a first conductive layer 50, a memory layer 60, a second conductive layer 70, a memory layer 60, and a first conductive layer 50 from the lower layer toward an upper layer. That is, one second conductive layer 70 is shared by two memory layers 60 located above and below the second conductive layer 70. The first conductive layer 50 acts as the word line WL. The memory layer 60 acts as the memory cell MC. The second conductive layer 70 acts as the bit line BL.

As illustrated in FIG. 2, the first conductive layers 50 are formed into a stripe shape extending in the X-direction while arrayed in the Y-direction at predetermined intervals. Desirably the first conductive layer 50 is made of a material having a heat-resistant property and a low resistance. For example, the first conductive layer 50 is made of tungsten (W), titanium (Ti), tantalum (Ta), a nitride thereof, or a stacked structure thereof.

As illustrated in FIG. 2, each of the memory layers 60 is provided between the first conductive layer 50 and the second conductive layer 70, and the memory layers 60 are arranged in a matrix form in the X-direction and the Y-direction.

As illustrated in FIG. 2, the second conductive layers are formed into the stripe shape extending in the Y-direction while arrayed in the X-direction at predetermined intervals to come into contact with the upper surfaces of the memory layers 60. Desirably the second conductive layer 70 is made of a material having the heat-resistant property and the low resistance. For example, the second conductive layer 70 is made of tungsten (W), titanium (Ti), tantalum (Ta), a nitride thereof, or a stacked structure thereof.

Figure 3:
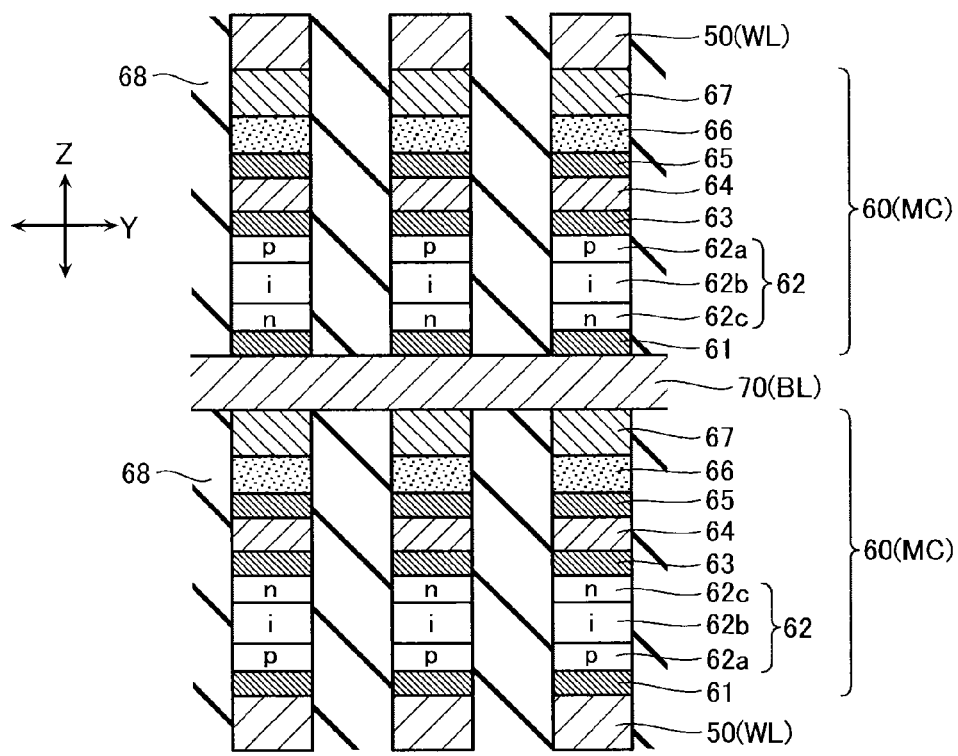
FIG. 3 is a sectional view illustrating a memory layer 60 according to the first embodiment.

Next, the detailed stacked structure of the memory layer 60 will be described below with reference to FIG. 3. FIG. 3 is a sectional view illustrating the memory layer 60. Referring to FIG. 3, the memory layer 60 includes a barrier metal layer 61, a diode layer 62, a lower electrode layer 63, a variable resistance layer 64, an upper electrode layer 65, a liner layer 66, a stopper layer 67, and an inter-layer insulator 68.

The barrier metal layer 61 contacts an upper surface of the first conductive layer 50. The barrier metal layer 61 is made of titanium nitride (TiN).

The diode layer 62 contacts an upper surface of the barrier metal layer 61. The diode layer 62 acts as the diode DI. The diode layer 62 is made of polysilicon. The diode layer 62 includes a p-type semiconductor layer 62a, an intrinsic semiconductor layer 62b, and an n-type semiconductor layer 62c. The stacking order of the p-type semiconductor layer 62a, the intrinsic semiconductor layer 62b, and the n-type semiconductor layer 62c is inverted in the upper layer and the lower layer of the second conductive layer 70.

The lower electrode layer 63 contacts an upper surface of the diode layer 62. The lower electrode layer 63 is made of titanium nitride (TiN). Alternatively, the lower electrode layer 63 may be made of Pt, Au, Ag, TiAlN, SrRuO, Ru, RuN, IR, Co, Ti, TaN, LaNiO, Al, PtIrOx, PtRhOx, Rh, or TaAlN.

The variable resistance layer 64 contacts an upper surface of the lower electrode layer 63. The variable resistance layer 64 acts as the variable resistance element R. In the variable resistance layer 64, the resistance value is changed depending on at least one of an applied voltage, a passed current, and an injected charge. For example, the variable resistance layer 64 is made of a metal oxide.

The upper electrode layer 65 contacts an upper surface of the variable resistance layer 64. The upper electrode layer 65 is made of the same material as the lower electrode layer 63.

The liner layer 66 contacts an upper surface of the upper electrode layer 65. The liner layer 66 is configured such that, compared with the stopper layer 67, an orientation of a lower layer of the liner layer 66 has no influence on an orientation of an upper layer of the liner layer 66. In other words, the liner layer 66 is made of a material that has a property for canceling the influence of the orientation of the lower layer of the liner layer 66, the property being superior compared with the stopper layer 67. For example, the liner layer 66 is made of amorphous silicon (amorphous-Si), tungsten silicide (WSi), or tungsten nitride (WN).

The stopper layer 67 contacts an upper surface of the liner layer 66. An etching rate of the stopper layer 67 by Chemical Mechanical Polishing (CMP) is smaller than an etching rate of the inter-layer insulator 68 by the CMP. For example, the stopper layer 67 is made of tungsten (W).

The inter-layer insulator 68 contacts the first interconnection layer 50, a side surface of the memory layer 60, and the second conductive layer 70. For example, the inter-layer insulator 68 is made of silicon oxide ($SiO_2$).

[Advantage]

Figure 4:
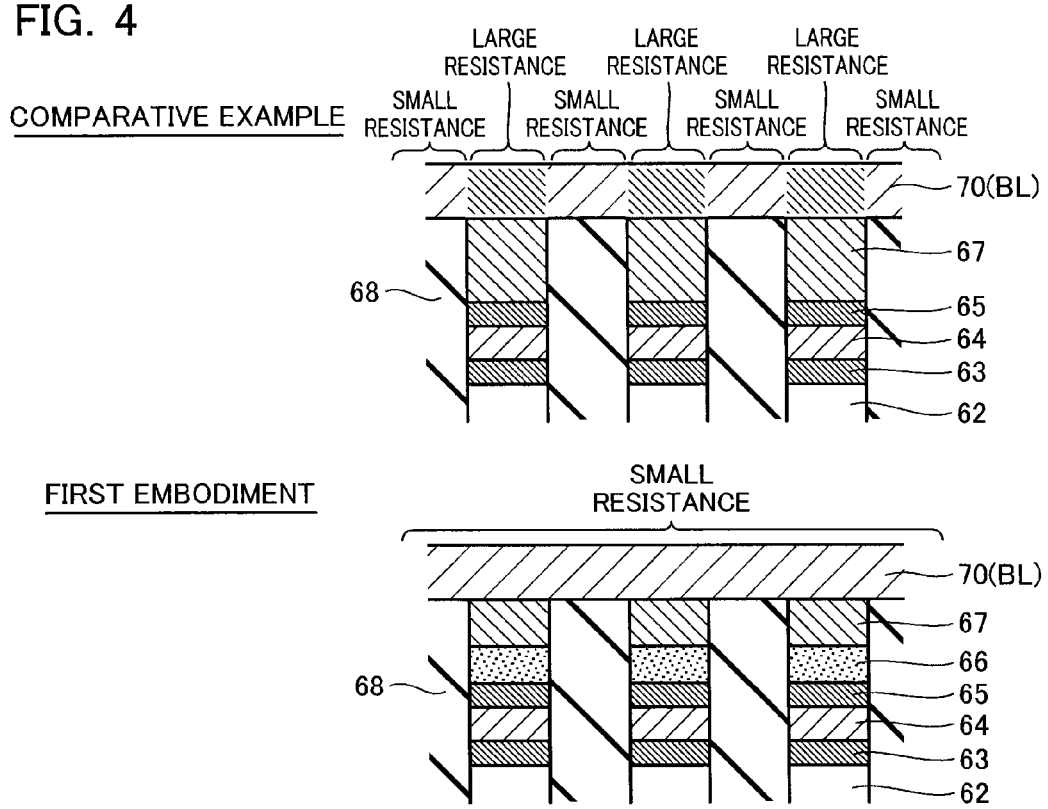
FIG. 4 is a view of a comparison between the first embodiment and a comparative example.

Referring to FIG. 4, an advantage of the first embodiment will be described below by a comparison of the first embodiment and a comparative example. As illustrated in FIG. 4, the comparative example has a configuration in which the liner layer 66 of the first embodiment is eliminated. That is, in the comparative example, one of surfaces of the stopper layer 67 contacts the upper electrode layer 65, and the other surface contacts the second conductive layer 70. In the comparative example, the second conductive layer 70 is formed while the orientation of the upper electrode layer 65 has an influence on the second conductive layer 70 through the stopper layer 67 as illustrated in FIG. 4. Therefore, the second conductive layer 70 has a small grain size and a high resistance.

On the other hand, in the first embodiment, the second conductive layer 70 is formed while the liner layer 66 reduces the influence of the orientation of the upper electrode layer 65. Therefore, the second conductive layer 70 has the grain size larger than that of the comparative example and the resistance lower than that of the comparative example. Accordingly, in the first embodiment, an interconnection resistance of the second conductive layer 70 can be reduced compared with the comparative example.

[Manufacturing Method]

Figure 5:
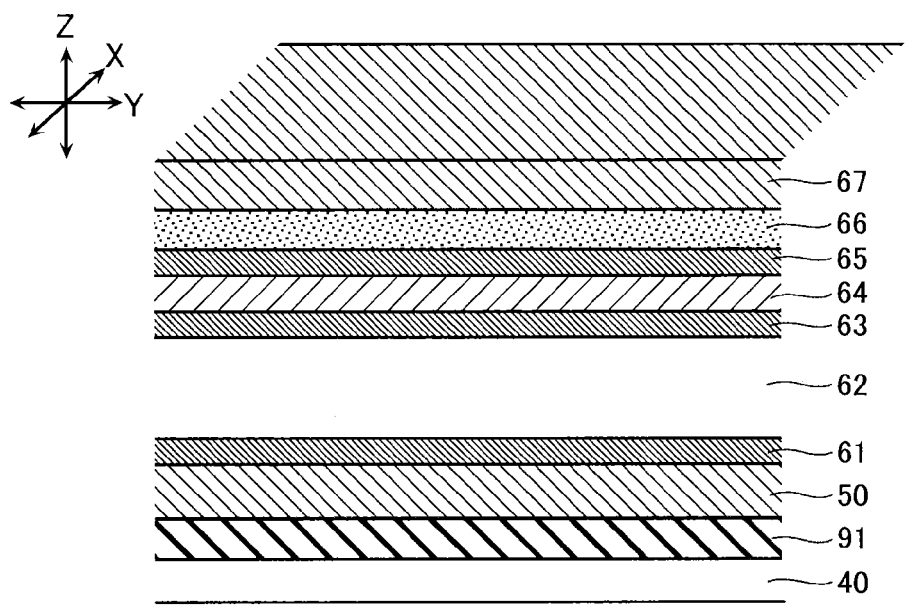
FIG. 5 is a sectional view of the semiconductor storage device in a manufacturing process according to the first embodiment.

A manufacturing method of the semiconductor storage device in the first embodiment will be described below with reference to FIGS. 5 to 11. As illustrated in FIG. 5, the first interconnection layer 50, the barrier metal layer 61, the diode layer 62, the lower electrode layer 63, the variable resistance layer 64, the upper electrode layer 65, the liner layer 66, and the stopper layer 67 are stacked on the substrate 40 via an insulating layer 91.

Specifically, tungsten (W) having a thickness of 50 nm is deposited by a sputtering method to form the first interconnection layer 50. The first interconnection layer 50 may have a stacked structure of tungsten (W) and tungsten nitride (WN). Titanium nitride (TiN) having the thickness of 5 nm is deposited by the sputtering method to form the barrier metal layer 61. Non-crystalline silicon having the thickness of 85 nm is deposited by an LPCVD method to form the diode layer 62. The diode layer 62 is formed by sequentially stacking a phosphorus-doped p-type semiconductor layer, an intrinsic semiconductor layer in which an impurity is not doped, and a boron-doped n-type semiconductor layer. A natural oxide layer formed on the surface of the diode layer 62 is removed by a wet treatment. The lower electrode layer 63 is formed by depositing titanium nitride (TiN) by the sputtering method. The variable resistance layer 64 is formed by the LPCVD method or the sputtering method. The liner layer 66 is formed by the sputtering method.

Figure 6:
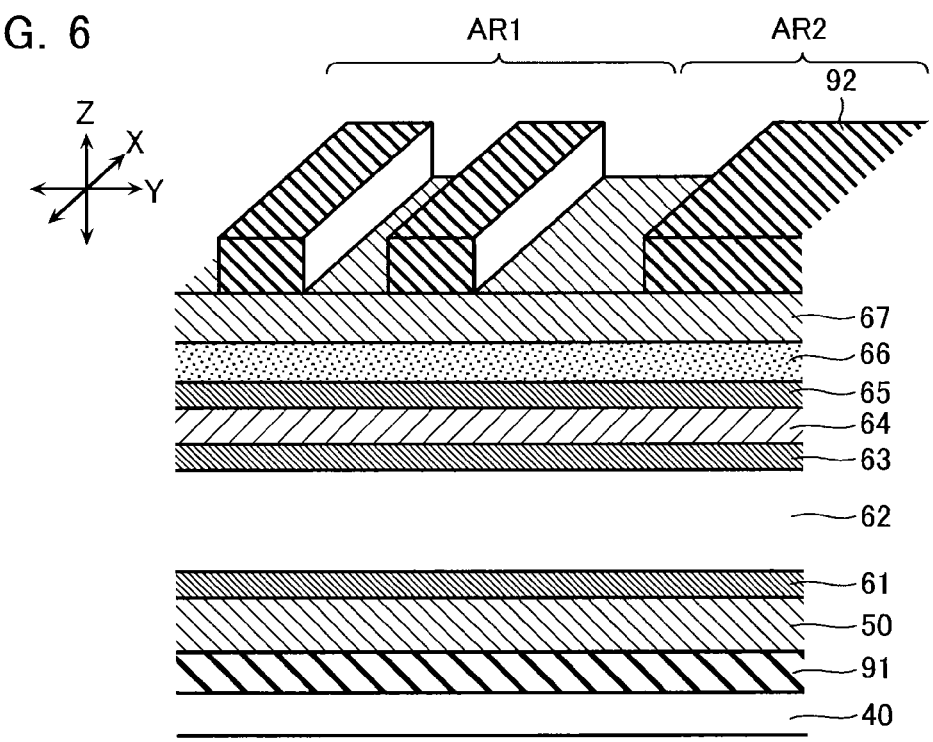
FIG. 6 is a sectional view of the semiconductor storage device in the manufacturing process according to the first embodiment.

As illustrated in FIG. 6, a hard mask 92 is formed on an upper surface of the stopper layer 67. d-TEOS having the thickness of 200 nm is deposited by a CVD method, and patterned by a lithography method, thereby forming the hard mask 92. In a memory area AR1 where the memory cell array 10 is formed, the hard masks 92 are formed into the strip shape extending in the X-direction while arrayed in the Y-direction at predetermined intervals. On the other hand, in a peripheral area AR2 located around the memory area AR1, the hard mask 92 is formed so as to cover the whole of the peripheral area AR2.

Figure 7:
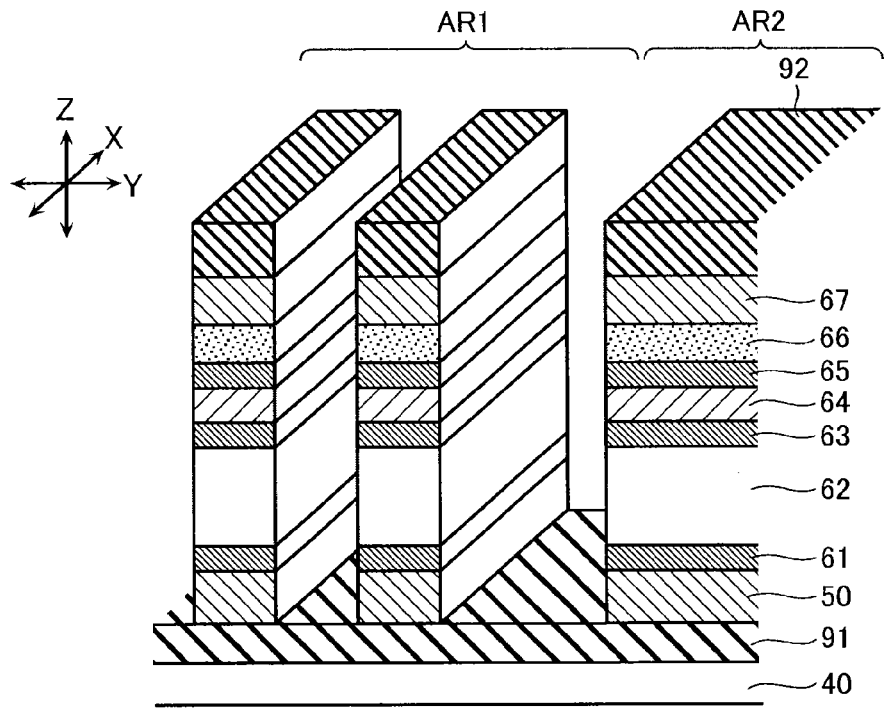
FIG. 7 is a sectional view of the semiconductor storage device in the manufacturing process according to the first embodiment.

As illustrated in FIG. 7, etching is performed to the first interconnection layer 50 through the hard mask 92 by an RIE method. Therefore, the first interconnection layers 50, the barrier metal layers 61, the diode layers 62, the lower electrode layers 63, the variable resistance layers 64, the upper electrode layers 65, the liner layers 66, and the stopper layers 67 are formed into the stripe shape extending in the X-direction while arrayed in the Y-direction at predetermined intervals.

Figure 8:
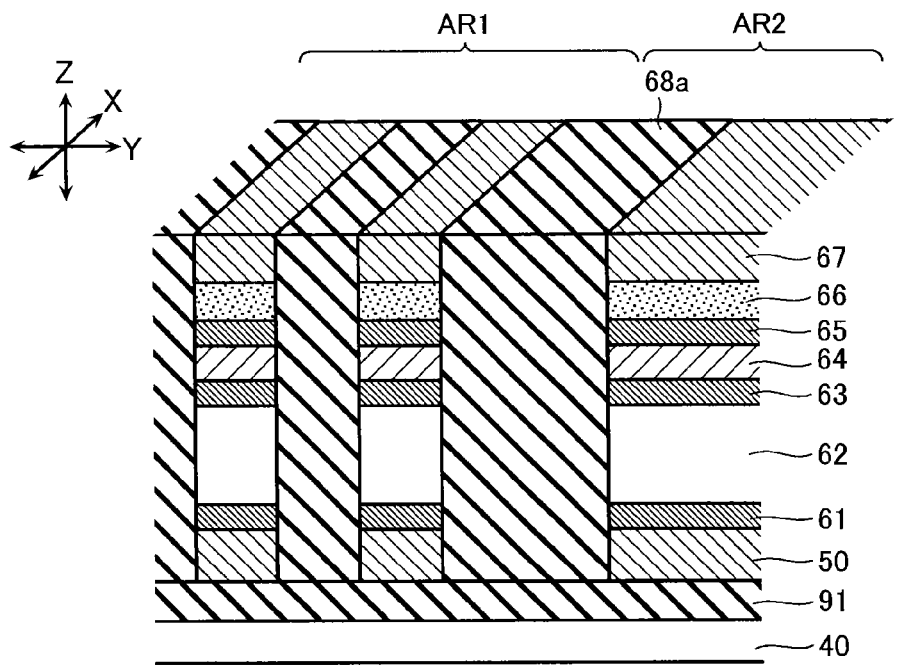
FIG. 8 is a sectional view of the semiconductor storage device in the manufacturing process according to the first embodiment.

As illustrated in FIG. 8, the inter-layer insulator 68a is formed so as to cover the hard mask 92 and the stopper layer 67. Then, the hard mask 92 and the inter-layer insulator 68a are planarized to the upper surface of the stopper layer 67 by the CMP.

Figure 9:
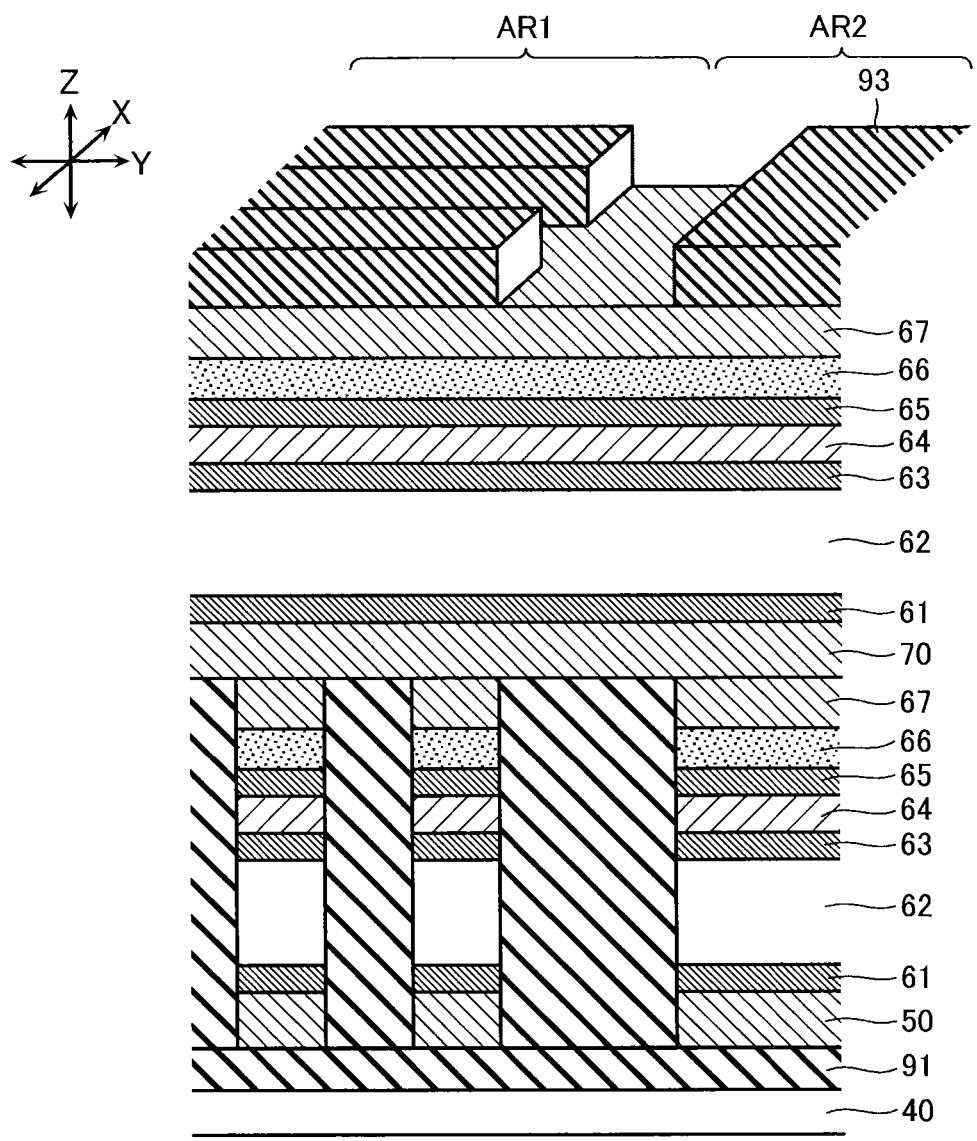
FIG. 9 is a sectional view of the semiconductor storage device in the manufacturing process according to the first embodiment.

As illustrated in FIG. 9, the second conductive layer 70, the barrier metal layer 61, the diode layer 62, the lower electrode layer 63, the variable resistance layer 64, the upper electrode layer 65, the liner layer 66, and the stopper layer 67 are stacked on the stopper layer 67 of the uppermost layer. At this point, the diode layer 62 is formed by sequentially stacking the n-type semiconductor layer, the intrinsic semiconductor layer, and the p-type semiconductor layer.

As illustrated in FIG. 9, a hard mask 93 is formed on the upper surface of the stopper layer 67. d-TEOS having the thickness of 200 nm is deposited by the CVD method, and patterned by the lithography method, thereby forming a hard mask 93. In the memory area AR1, the hard masks 93 are formed into the strip shape extending in the Y-direction while arrayed in the X-direction at predetermined intervals. On the other hand, in the peripheral area AR2, the hard mask 93 is formed so as to cover the whole of the peripheral area AR2.

Figure 10:
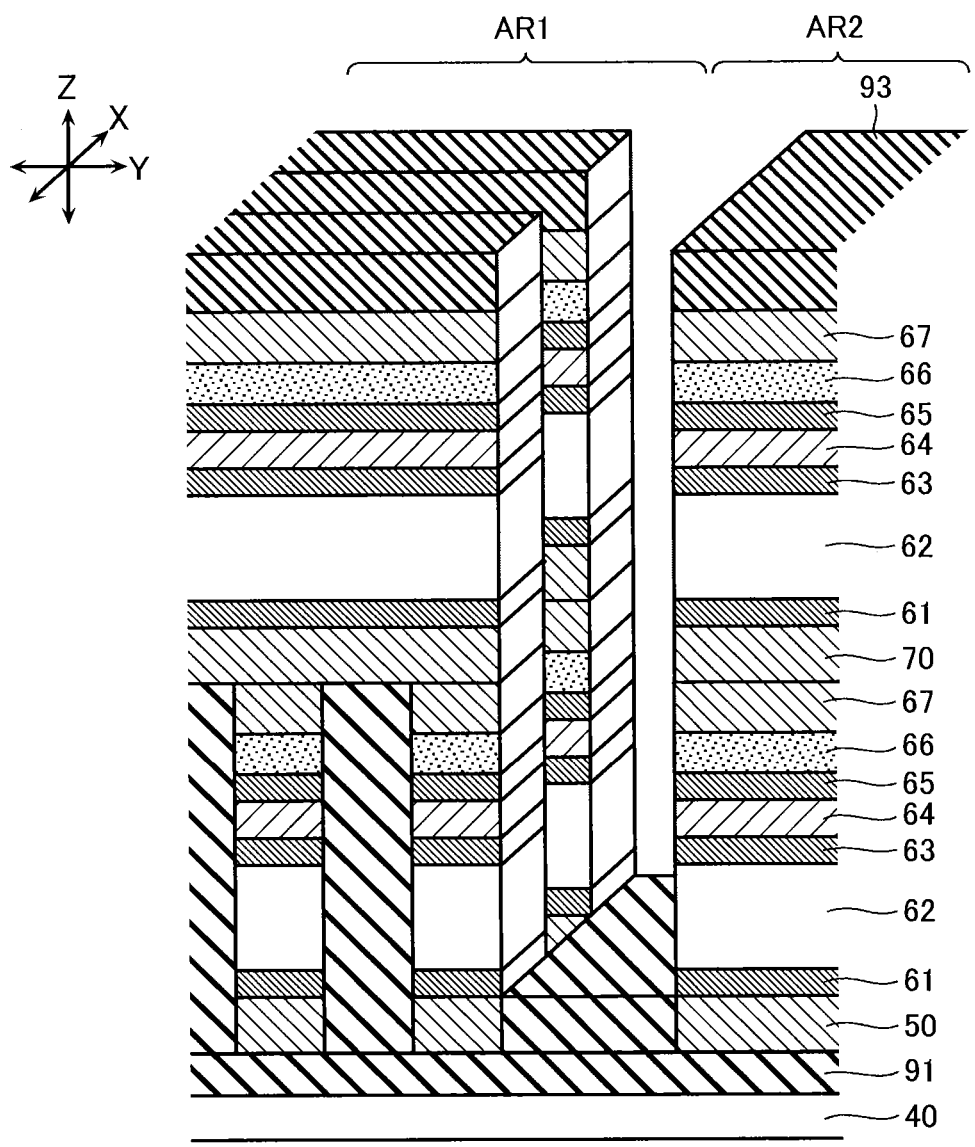
FIG. 10 is a sectional view of the semiconductor storage device in the manufacturing process according to the first embodiment.

As illustrated in FIG. 10, the etching is performed to the barrier metal layer 61 that contacts the upper surface of the first interconnection layer 50 through the hard mask 93. Therefore, the barrier metal layer 61, the diode layers 62, the lower electrode layers 63, the variable resistance layers 64, the upper electrode layers 65, the liner layers 66, and the stopper layers 67 are formed so as to be arranged in a matrix form in the Y-direction and the X-direction at predetermined intervals in the lower layer of the second conductive layer 70. The second conductive layers 70 are formed into the stripe pattern extending in the Y-direction while arrayed in the X-direction at predetermined intervals. The barrier metal layers 61, the diode layers 62, the lower electrode layers 63, the variable resistance layers 64, the upper electrode layers 65, the liner layers 66, and the stopper layers 67 are formed into the stripe pattern extending in the Y-direction while arrayed in the X-direction at predetermined intervals in the upper layer of the second conductive layer 70.

Figure 11:
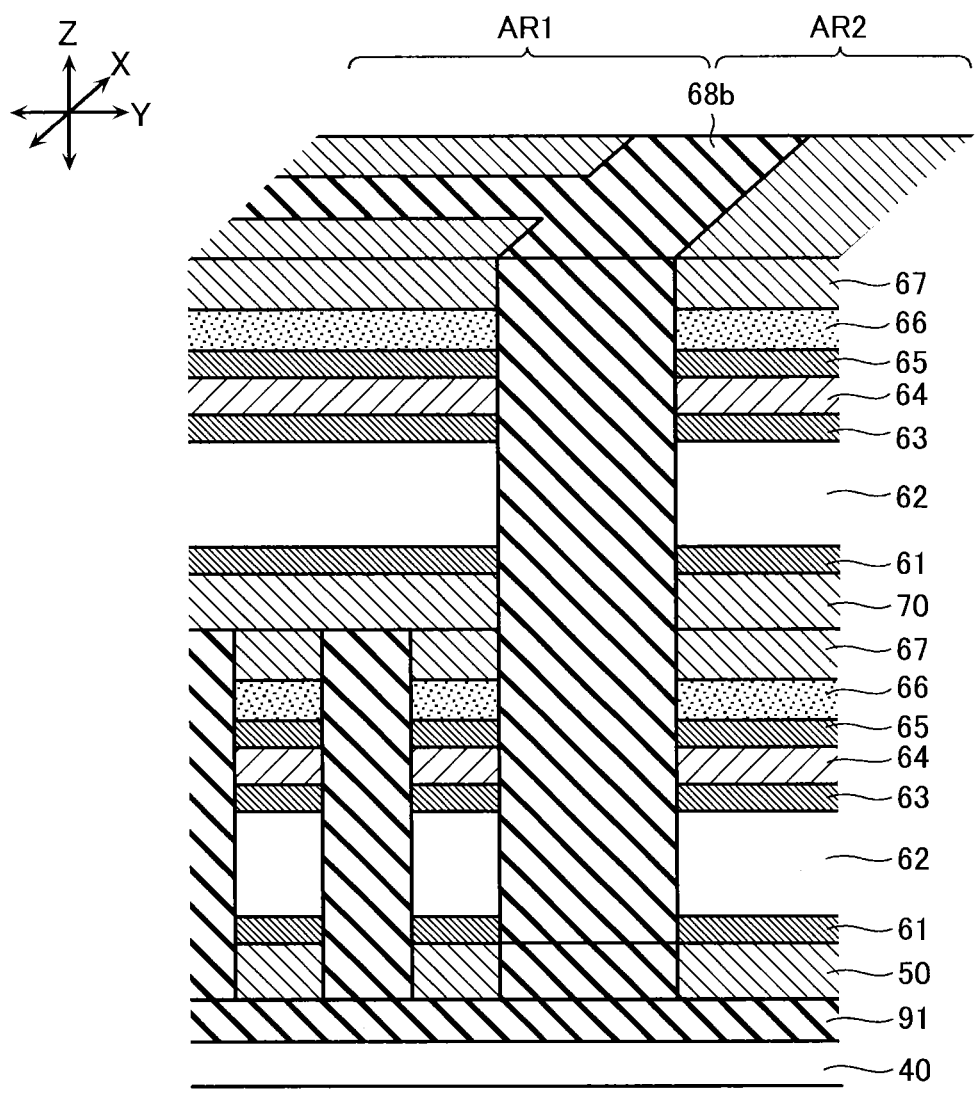
FIG. 11 is a sectional view of the semiconductor storage device in the manufacturing process according to the first embodiment.

As illustrated in FIG. 11, the inter-layer insulator 68b is formed so as to cover the hard mask 93 and the upper surface of the stopper layer 67 of the uppermost layer. Then, the hard mask 93 and the inter-layer insulator 68b are planarized to the upper surface of the stopper layer 67 by the CMP. Then, the same processes in FIGS. 5 to 11 are repeatedly performed.

Second Embodiment

Figure 12:
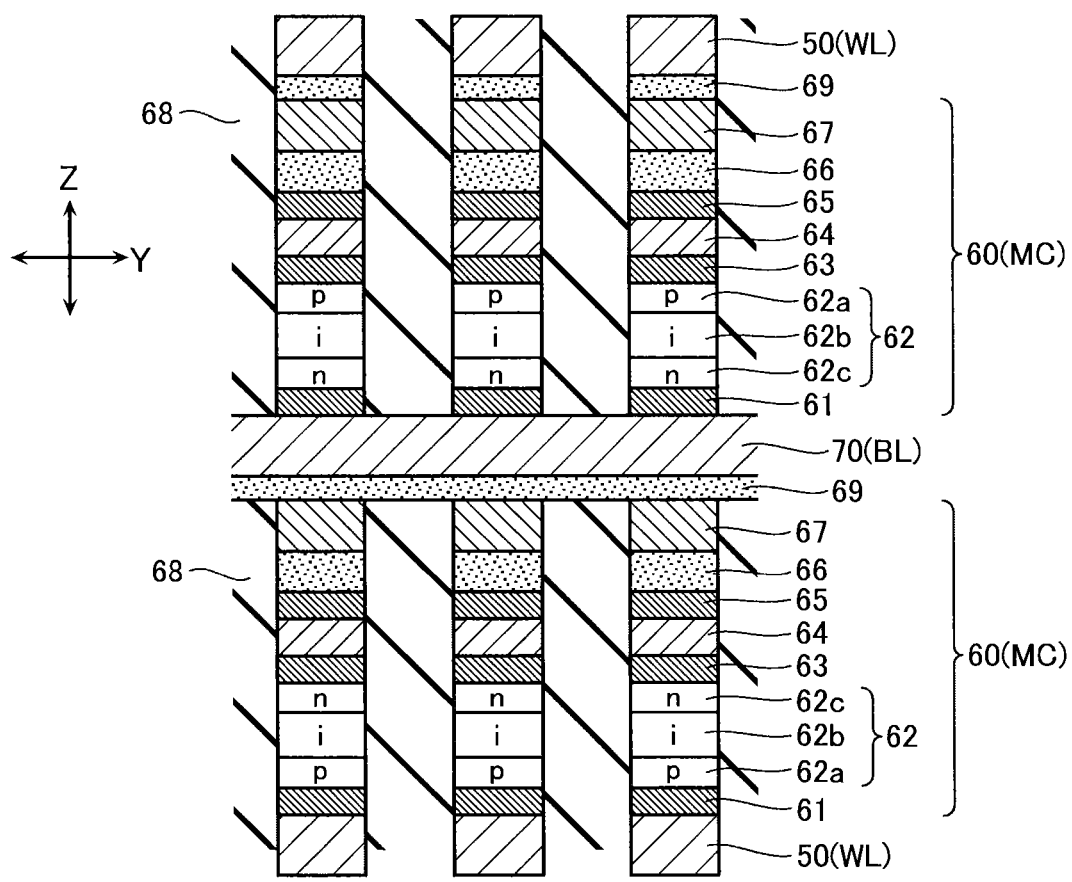
FIG. 12 is a sectional view illustrating a memory layer 60 according to a second embodiment.

A semiconductor storage device according to a second embodiment will be described below with reference to FIG. 12. As illustrated in FIG. 12, in addition to the configuration of the first embodiment, the semiconductor storage device of the second embodiment includes a liner layer 69 that contacts the upper surface of the stopper layer 67. The liner layer 69 is configured such that, compared with the stopper layer 67, an orientation of a lower layer of the liner layer 69 has no influence on an orientation of a upper layer of the liner layer 69. In other words, the liner layer 69 is made of a material that has a property for canceling the influence of the orientation of the lower layer of the liner layer 69, the property being superior compared with the stopper layer 67. For example, the liner layer 69 is made of amorphous silicon (amorphous-Si), tungsten silicide (WSi), or tungsten nitride (WN).

The second conductive layer 70 is formed while the liner layer 69 reduces the influence of the orientation of the stopper layer 67, and the second conductive layer 70 of the second embodiment has the grain size larger than that of the first embodiment. Therefore, in the second embodiment, the interconnection resistance of the second conductive layer 70 can be reduced compared with the first embodiment.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
a semiconductor substrate having a main surface;
a first conductive layer provided above the main surface of the semiconductor substrate and extending in a first direction;
a variable resistance layer provided above the first conductive layer;
an electrode layer contacting an upper surface of the variable resistance layer;
a first liner layer directly contacting an upper surface of the electrode layer;
a stopper layer directly contacting an upper surface of the first liner layer; and
a second conductive layer provided above the stopper layer and extending in a second direction crossing the first direction,
the first liner layer being made of a material having a property for canceling an influence of an orientation of a lower layer of the first liner layer, the property of the first liner layer being superior compared with that of the stopper layer, and
the semiconductor substrate, the first conductive layer, the variable resistance layer, the electrode layer, the first liner layer, the stopper layer, and the second conductive layer being arranged in this order and above the semiconductor substrate in a direction perpendicular to the main surface of the substrate.

2. The semiconductor storage device according to claim 1, wherein the first liner layer is made of one of tungsten nitride, tungsten silicon, and amorphous silicon.

3. The semiconductor storage device according to claim 1, further comprising:
   an inter-layer insulator contacting a side surface of the variable resistance layer, a side surface of the electrode layer, a side surface of the first liner layer, and a side surface of the stopper layer; and
   a second liner layer contacting an upper surface of the stopper layer and an upper surface of the inter-layer insulator,
   the second liner layer being made of a material having a property for canceling an influence of an orientation of a lower layer of the second liner layer, the property of the second liner layer being superior compared with that of the stopper layer.

4. The semiconductor storage device according to claim 3, wherein the second liner layer is made of one of tungsten nitride, tungsten silicon, and amorphous silicon.

5. The semiconductor storage device according to claim 1, wherein the electrode layer is made of titanium nitride.

6. The semiconductor storage device according to claim 1, further comprising a diode layer provided between the first conductive layer and the variable resistance layer.

7. The semiconductor storage device according to claim 6, further comprising a barrier metal layer contacting an upper surface of the first conductive layer and a lower surface of the diode layer,
   the barrier metal layer being made of titanium nitride (TiN).

8. The semiconductor storage device according to claim 1, wherein the first conductive layer and the second conductive layer are made of one of tungsten (W), titanium (Ti), tantalum (Ta), a nitride thereof, and a stacked structure thereof.

9. The semiconductor storage device according to claim 1, wherein the variable resistance layer is made a metal oxide.

10. The semiconductor storage device according to claim 1, wherein the stopper layer is made of tungsten.

11. The semiconductor storage device according to claim 6, wherein the diode layer is made of polysilicon.

12. The semiconductor storage device according to claim 1, wherein
   the first conductive layer extends in a first direction, and
   the second conductive layer extends in a second direction, and intersects the first conductive layer.

* * * * *